(12) United States Patent
Kim et al.

(10) Patent No.: US 9,252,340 B2
(45) Date of Patent: Feb. 2, 2016

(54) PHOSPHOR AND LIGHT EMITTING DEVICE PACKAGE INCLUDING THE SAME

(71) Applicant: LG INNOTEK CO., LTD., Seoul (KR)

(72) Inventors: Tae Hun Kim, Seoul (KR); Ji Na Lee, Seoul (KR); Mi Jung Han, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/254,931

(22) Filed: Apr. 17, 2014

(65) Prior Publication Data

US 2014/0339584 A1  Nov. 20, 2014

(30) Foreign Application Priority Data

May 16, 2013 (KR) .......... 10-2013-0056027
Oct. 1, 2013 (KR) .......... 10-2013-0117219

(51) Int. Cl.
| | | |
|---|---|---|
| H01L 33/00 | (2010.01) | |
| H01L 33/50 | (2010.01) | |
| C09K 11/08 | (2006.01) | |
| C09K 11/77 | (2006.01) | |
| H01L 23/00 | (2006.01) | |

(52) U.S. Cl.
CPC .......... *H01L 33/504* (2013.01); *C09K 11/0883* (2013.01); *C09K 11/7728* (2013.01); *C09K 11/7734* (2013.01); *C09K 11/7766* (2013.01); *C09K 11/7783* (2013.01); *H01L 24/14* (2013.01); *H01L 2224/48091* (2013.01); *H01L 2224/48227* (2013.01); *H01L 2224/48465* (2013.01); *H01L 2224/49107* (2013.01); *H01L 2224/49113* (2013.01); *H01L 2924/12041* (2013.01)

(58) Field of Classification Search
CPC .......... H01L 33/00; H01L 33/50; H01L 33/54; H01L 33/62; H01L 33/504
USPC .................................. 257/98, 107
See application file for complete search history.

(56) References Cited

U.S. PATENT DOCUMENTS

| | | | | |
|---|---|---|---|---|
| 7,084,436 B2* | 8/2006 | DenBaars | ........... | H01L 33/08 257/101 |
| 8,558,252 B2* | 10/2013 | Ibbetson | ........... | H01L 33/0095 257/88 |
| 8,598,608 B2* | 12/2013 | Kuzuhara | ........... | H01L 33/504 257/98 |
| 8,648,372 B2* | 2/2014 | Ishimori | ........... | H01L 25/0753 257/79 |
| 8,664,635 B2* | 3/2014 | Jung | ........... | H01L 33/505 257/13 |
| 8,680,550 B2* | 3/2014 | Kim | ........... | H01L 33/508 257/98 |
| 8,686,454 B2* | 4/2014 | Choi | ........... | H01L 33/08 257/435 |

(Continued)

OTHER PUBLICATIONS

Mikami et al., "5d Levels of rare-earth ions in oxynitride/nitride phophors: To what extent is the idea covalency reliable?," Optical Materials, vol. 33, No. 2, pp. 145-148, Dec. 1, 2010.

(Continued)

*Primary Examiner* — Michael Lebentritt
(74) *Attorney, Agent, or Firm* — Birch, Stewart, Kolasch & Birch, LLP

(57) ABSTRACT

Embodiments provide a phosphor including a silicate-based first phosphor emitting light having a yellow wavelength, a nitride-based second phosphor emitting light having a green wavelength, and a nitride-based third phosphor emitting light having a red wavelength. A full width at half maximum of the spectrum of mixed light emitted from the first phosphor to the third phosphor as the phosphors are excited by light having a blue wavelength is 110 nm or more.

20 Claims, 11 Drawing Sheets

(56) References Cited

U.S. PATENT DOCUMENTS

| | | | | |
|---|---|---|---|---|
| 8,686,625 B1* | 4/2014 | Ashdown | | H01L 33/504 257/98 |
| 8,829,546 B2* | 9/2014 | DenBaars | | H01L 33/025 257/103 |
| 8,852,454 B2* | 10/2014 | Yoshimatsu | | C09K 11/0883 252/301.4 F |
| 8,921,875 B2* | 12/2014 | LeToquin | | H01L 25/0753 257/12 |
| 8,974,695 B2* | 3/2015 | Dutta | | 252/301.4 H |
| 8,981,392 B2* | 3/2015 | Song | | H01L 25/0753 257/88 |
| 9,082,939 B2* | 7/2015 | Yamakawa | | C09K 11/7734 |
| 9,099,409 B2* | 8/2015 | Fujita | | H01L 27/322 |
| 2007/0007494 A1* | 1/2007 | Hirosaki | | C01B 21/0602 252/301.4 R |
| 2008/0164806 A1 | 7/2008 | Chen | | |
| 2009/0134775 A1* | 5/2009 | Watanabe | | C04B 35/581 313/503 |
| 2009/0236620 A1* | 9/2009 | Park | | G02F 1/133603 257/89 |
| 2009/0267485 A1* | 10/2009 | Nagatomi et al. | | C09K 11/0883 313/503 |
| 2010/0085728 A1* | 4/2010 | Seto | | C09K 11/0883 362/84 |
| 2011/0157916 A1 | 6/2011 | Lee et al. | | |
| 2012/0267999 A1* | 10/2012 | Sakuta | | C09K 11/7739 313/503 |
| 2012/0274240 A1 | 11/2012 | Lee et al. | | |
| 2014/0209944 A1* | 7/2014 | Kim | | H01L 33/28 257/89 |
| 2014/0376259 A1* | 12/2014 | Choi | | G02B 6/0026 362/608 |
| 2015/0175881 A1* | 6/2015 | Hirosaki | | H01L 33/502 313/486 |

OTHER PUBLICATIONS

Seto et al., "A New Yellow Phosphor La2Si6N11:Ce3+ for White LEDs," ECS Transactions, vol. 25, No. 9, pp. 247-252, Jan. 1, 2009.

* cited by examiner

PHOSPHOR AND LIGHT EMITTING DEVICE PACKAGE INCLUDING THE SAME

CROSS REFERENCE TO RELATED APPLICATION

This application claims priority under 35 U.S.C. §119 to Korean Patent Application No. 10-2013-0056027, filed in Korea on May 16, 2013 and No. 10-2013-0117219, filed in Korea on Oct. 1, 2013, which are hereby incorporated in its entirety by reference as if fully set forth herein.

TECHNICAL FIELD

Embodiments relate to phosphors and light emitting device packages including the same.

BACKGROUND

Light emitting devices, such as Light Emitting Diodes (LEDs) or Laser Diodes (LDs), which use group III-V or group II-VI compound semiconductors, are capable of emitting light of various colors, such as red, green and blue, ultraviolet light and the like, owing to developments of device materials and thin film growth technologies. Moreover, these light emitting devices are capable of emitting white light with high efficiency through use of a fluorescent substance or color combination, and have advantages of low power consumption, semi-permanent lifespan, fast response time, safety and environmental friendliness as compared to conventional light sources, such as fluorescent lamps, incandescent lamps and the like.

Accordingly, application sectors of light emitting diodes are expanded up to transmitting modules of optical communication means, LED backlights to replace Cold Cathode Fluorescence Lamps (CCFLs) which serve as backlights of Liquid Crystal Display (LCD) apparatuses, white LED lighting apparatuses to replace fluorescent lamps or incandescent lamps, head lights of vehicles and traffic lights.

A light emitting device includes a light emitting structure disposed on a substrate formed of sapphire, for example. The light emitting structure includes a first conductive semiconductor layer, an active layer, and a second conductive semiconductor layer, and a first electrode and a second electrode are respectively disposed on the first conductive semiconductor layer and the second conductive semiconductor layer.

The light emitting device emits light having energy determined by an intrinsic energy-band of a material constituting the active layer in which electrons introduced through the first conductive semiconductor layer and holes introduced through the second conductive semiconductor layer meet each other. Light emitted from the active layer may vary based on the composition of the material constituting the active layer, and may be blue light, ultraviolet (UV) or deep UV, for example.

A light emitting device package includes a cerium-doped Yttrium Aluminum Garnet (YAG) phosphor. The phosphors are excited by blue light emitted from the light emitting device, thus generating yellow light. As such, white light may be created via mixing of yellow light and blue light.

Attempts have been made to replace the aforementioned YAG phosphor with a silicate phosphor or a nitride phosphor.

However, using the silicate phosphor alone may be problematic in terms of thermal stability. In the case of long-term use of the light emitting device package, the silicate phosphors are deteriorated by heat radiated from a light emitting diode, causing gradual luminance reduction.

In addition, using the nitride phosphor alone causes a lower luminous intensity than that of the YAG phosphor.

Deterioration of the phosphors and luminance reduction may result in luminance reduction and color discordance of a backlight unit, for example, using the light emitting device package.

SUMMARY

Embodiments provide phosphors having excellent color reproduction and less luminance reduction due to heat.

In one embodiment, a phosphor includes a silicate-based first phosphor emitting light having a yellow wavelength, a nitride-based second phosphor emitting light having a green wavelength, and a nitride-based third phosphor emitting light having a red wavelength, wherein a full width at half maximum of the spectrum of mixed light, emitted from the first phosphor to the third phosphor as the phosphors are excited by light having a blue wavelength, is 110 nm or more.

In another embodiment, a light emitting device package includes a first electrode and a second electrode electrically isolated from each other, at least one light emitting device electrically connected to each of the first electrode and the second electrode to emit light having a first wavelength, and phosphors excited by light having a blue wavelength emitted from the light emitting device to emit light having a second wavelength, the phosphors including a silicate-based first phosphor emitting light having a yellow wavelength, a nitride-based second phosphor emitting light having a green wavelength, and a nitride-based third phosphor emitting light having a red wavelength, wherein a full width at half maximum of the spectrum of mixed light emitted from the first phosphor to the third phosphor as the phosphors are excited by light having a blue wavelength is 110 nm or more.

In accordance with a further embodiment, a phosphor includes a first phosphor emitting light having a yellow wavelength, a second phosphor emitting light having a green wavelength, and a third phosphor emitting light having a red wavelength, wherein the first phosphor, the second phosphor, and the third phosphor contain nitrogen, and a full width at half maximum of the spectrum of mixed light emitted from the first phosphor to the third phosphor as the phosphors are excited by light having a blue wavelength is 119 nm or more.

BRIEF DESCRIPTION OF THE DRAWINGS

Arrangements and embodiments may be described in detail with reference to the following drawings in which like reference numerals refer to like elements and wherein.

DESCRIPTION OF SPECIFIC EMBODIMENTS

Figure 1A:
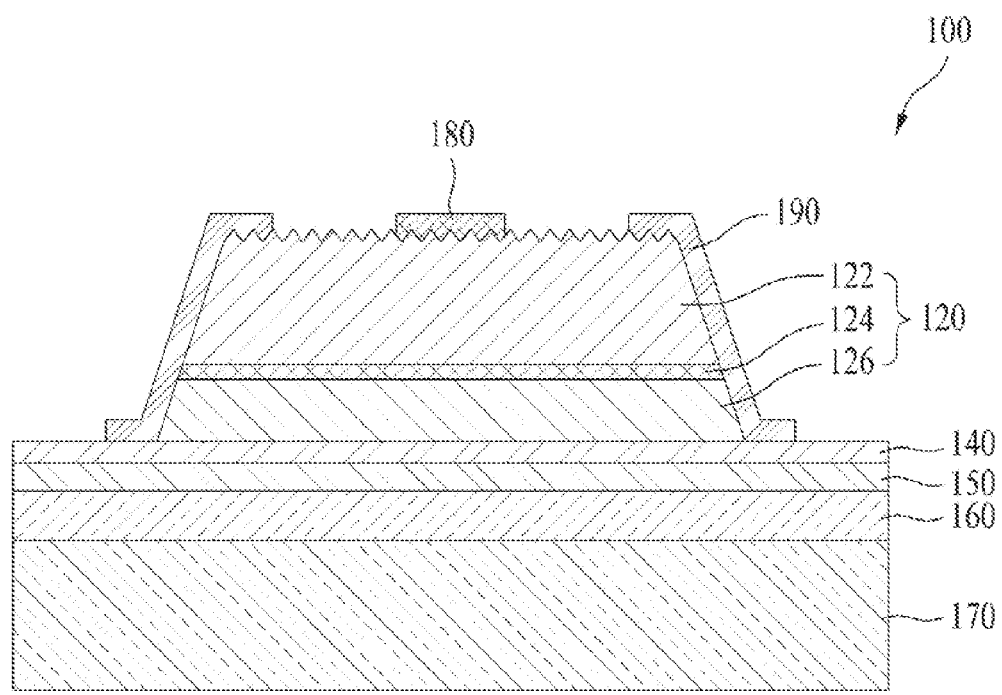
FIGS. 1A and 1B are views respectively showing different embodiments of a light emitting device.

Hereinafter, exemplary embodiments to concretely realize the above described object will be described with reference to the annexed drawings.

Prior to description of the embodiments, it will be understood that, when each element, such as a layer (film), region, pattern or structure is referred to as being formed "on" or "under" the other element, such as a substrate, layer (film), region, pad or pattern, it can be directly "on" or "under" the other element or be indirectly formed with intervening one or more other elements therebetween. Also, it will also be understood that "on" or "under" the element may be described relative to the drawings.

In the drawings, the thickness or size of each layer may be exaggerated, omitted or schematically illustrated for clarity and convenience. In addition, the size of each constituent element does not wholly reflect an actual size thereof.

FIG. 1A is a view showing one embodiment of a light emitting device.

A light emitting structure 120 includes a first conductive semiconductor layer 122, an active layer 124, and a second conductive semiconductor layer 126.

The first conductive semiconductor layer 122 may be formed of group III-V or group II-VI compound semiconductors, for example, and may be doped with a first conductive dopant. The first conductive semiconductor layer 122 may be formed of any one or more of semiconductor materials having a composition equation of $Al_xIn_yGa_{(1-x-y)}N$ ($0 \leq x \leq 1$, $0 \leq y \leq 1$, $0 \leq x+y \leq 1$), AlGaN, GaN, InAlGaN, AlGaAs, GaP, GaAs, GaAsP, and AlGaInP.

When the first conductive semiconductor layer 122 is an n-type semiconductor layer, the first conductive dopant may include an n-type dopant, such as Si, Ge, Sn, Se, Te, or the like. The first conductive semiconductor layer 122 may be formed in a single layer or in multiple layers, but is not limited thereto.

The active layer 124 is interposed between the first conductive semiconductor layer 122 and the second conductive semiconductor layer 126. The active layer 124 may have any one of a single well structure, a multi well structure, a single quantum well structure, a multi quantum well structure, a quantum dot structure, and a quantum line structure.

The active layer 124 may be formed of group III-V compound semiconductors, and include a well layer and a barrier layer having a pair structure of any one or more of AlGaN/AlGaN, InGaN/GaN, InGaN/InGaN, AlGaN/GaN, InAlGaN/GaN, GaAs(InGaAs)/AlGaAs, and GaP(InGaP)/AlGaP, but is not limited thereto. The well layer may be formed of a material having a smaller energy-band gap than an energy-band gap of the barrier layer.

The second conductive semiconductor layer 126 may be formed of compound semiconductors. More specifically, the second conductive semiconductor layer 126 may be formed of group III-V or II-VI compound semiconductors, and may be doped with a second conductive dopant. The second conductive semiconductor layer 126 may be formed of any one or more of semiconductor materials having a composition equation of $In_xAl_yGa_{1-x-y}N$ ($0 \leq x \leq 1$, $0 \leq y \leq 1$, $0 \leq x+y \leq 1$), AlGaN, GaN, AlInN, AlGaAs, GaP, GaAs, GaAsP, and AlGaInP. For example, the second conductive semiconductor layer 126 may be formed of $Al_xGa_{(1-x)}N$.

When the second conductive semiconductor layer 126 is a p-type semiconductor layer, the second conductive dopant may be a p-type dopant, such as Mg, Zn, Ca, Sr, Ba, or the like. The second conductive semiconductor layer 126 may be formed in a single layer or in multiple layers, but is not limited thereto.

The first conductive semiconductor layer 122 may have a patterned surface to enhance light-extraction efficiency, and a first electrode 180 may be disposed on a surface of the first conductive semiconductor layer 122. Although not shown, the surface of the first conductive semiconductor layer 122, on which the first electrode 180 is disposed, may not be patterned. The first electrode 180 may be formed in a single layer or in multiple layers and may be formed of at least one of aluminum (Al), titanium (Ti), chrome (Cr), nickel (Ni), copper (Cu), and gold (Au).

A passivation layer 190 may be disposed around the light emitting structure 120. The passivation layer 190 may be formed of an insulating material, such as non-conductive oxide or nitride. In one example, the passivation layer 190 may be formed of a silicon oxide ($SiO_2$) layer, an oxide nitride layer, and an oxide aluminum layer.

A second electrode must be disposed below the light emitting structure 120. An ohmic layer 140 and a reflective layer 150 may serve as a second electrode. A GaN layer may be disposed below the second conductive semiconductor layer 126 to ensure smooth introduction of current and holes into the second conductive semiconductor layer 126.

The ohmic layer 140 may have a thickness of about 200 angstroms. The ohmic layer 140 may be formed of at least one of Indium Tin Oxide (ITO), Indium Zinc Oxide (IZO), Indium Zinc Tin Oxide (IZTO), Indium Aluminum Zinc Oxide (IAZO), Indium Gallium Zinc Oxide (IGZO), Indium Gallium Tin Oxide (IGTO), Aluminum Zinc Oxide (AZO), Antimony Tin Oxide (ATO), Gallium Zinc Oxide (GZO), IZO Nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Sn, In, Ru, Mg, Zn, Pt, Au, and Hf, but is not limited to these materials.

The reflective layer 150 may be a metal layer formed of molybdenum (Mo), aluminum (Al), silver (Ag), nickel (Ni), platinum (Pt), rhodium (Rh), or alloys including Al, Ag, Pt or Rh. Aluminum, silver, or the like may effectively reflect light emitted from the active layer 124 to significantly enhance light-extraction efficiency of a semiconductor device, and molybdenum may be advantageous for the growth of plating on a protrusion that will be described hereinafter.

A support substrate 170 may be formed of a conductive material, such as a metal, a semiconductor material, or the like. More particularly, the support substrate 170 may be formed of a metal having high electric conductivity and thermal conductivity and may be formed of a high thermal conductivity material (for example, metal) in order to sufficiently dissipate heat generated during operation of a semiconductor device. For example, the support substrate 170 may be formed of a material selected from the group of molybdenum (Mo), silicon (Si), tungsten (W), copper (Cu) and aluminum (Al), or alloys thereof. In addition, the support substrate 170 may selectively include gold (Au), copper (Cu) alloy, nickel (Ni), copper-tungsten (Cu—W), carrier wafer (for example, GaN, Si, Ge, GaAs, ZnO, SiGe, SiC, SiGe, $Ga_2O_3$).

The support substrate 170 may have a thickness of 50~200 μm in order to achieve a sufficient mechanical strength to be efficiently separated as a chip during a scribing process and a breaking process without causing bending of a nitride semiconductor device.

A bonding layer 160 serves to bond the reflective layer 150 and the support substrate 170 to each other. The bonding layer 160 may be formed of a material selected from the group of gold (Au), tin (Sn), indium (In), aluminum (Al), silicon (Si), silver (Ag), nickel (Ni), and copper (Cu), or alloys thereof.

Figure 1B:
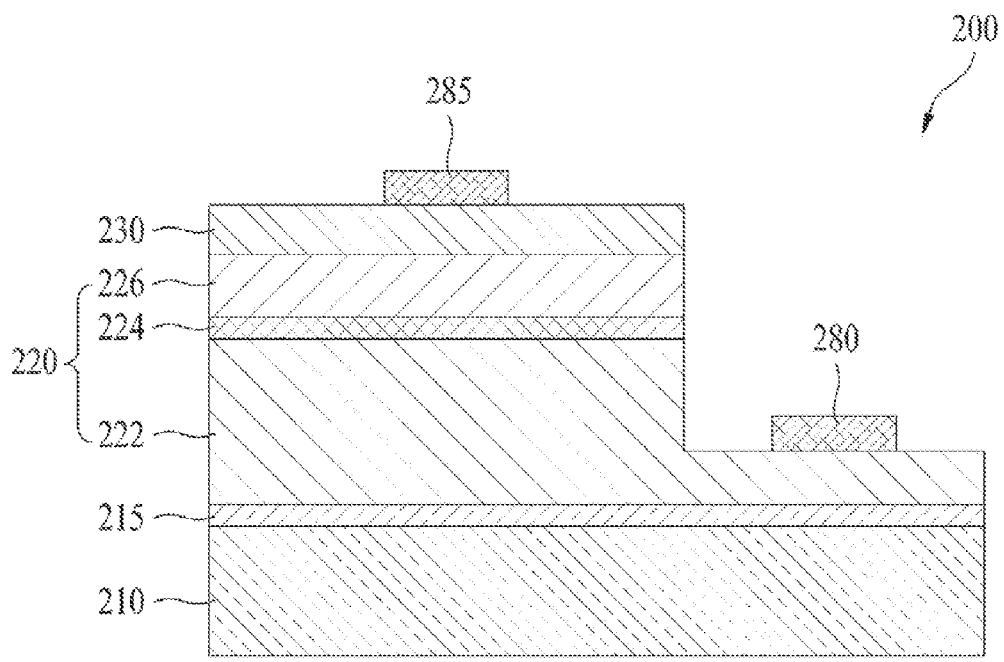

FIG. 1B is a view showing another embodiment of a light emitting device.

A light emitting device 200 according to the present embodiment includes a substrate 210, a buffer layer 215, and a light emitting structure 220.

The substrate 210 may be formed of a material suitable for the growth of a semiconductor material or a carrier wafer, or may be formed of a high thermal conductivity material. The substrate 210 may include a conductive substrate or an insulating substrate. For example, the substrate 210 may be formed of at least one of sapphire ($Al_2O_3$), $SiO_2$, SiC, Si, GaAs, GaN, ZnO, GaP, InP, Ge, and $Ga_2O_3$.

When the substrate 210 is formed of sapphire, for example, and the light emitting structure 220 including GaN, AlGaN, or the like is disposed on the substrate 210, for example, dislocation, melt-back, cracking, pitting, and surface morphology defects may occur due to great lattice mismatch between GaN or AlGaN and sapphire and a difference of coefficients of thermal expansion therebetween. Therefore, a buffer layer 215 formed of AlN, for example, may be disposed on the substrate 210.

Although not shown, an undoped GaN layer or AlGaN layer may be disposed between the buffer layer 215 and the light emitting structure 220 to prevent dislocation of the light emitting structure 220.

The light emitting structure 220 may include a first conductive semiconductor layer 222, an active layer 224, and a second conductive semiconductor layer 226. A detailed configuration and composition of the light emitting structure 220 are identical to those in the embodiment exemplarily shown in FIG. 1A.

When the light emitting structure 220 is formed of GaN, for example, and emits blue visible light, a transparent conductive layer 230 may be disposed on the light emitting structure 220 to enable uniform supply of current over a wide area from a second electrode 285 to the second conductive semiconductor layer 226.

When the substrate 210 is an insulating substrate, in order to supply current to the first conductive semiconductor layer 222, the transparent conductive layer 230 and a portion of the first conductive semiconductor layer 222 are subjected to mesa-etching to expose a portion of the first conductive semiconductor layer 222.

A first electrode 280 may be disposed on the exposed first conductive semiconductor layer 222, and the second electrode 285 may be disposed on the transparent conductive layer 230.

Figure 2:
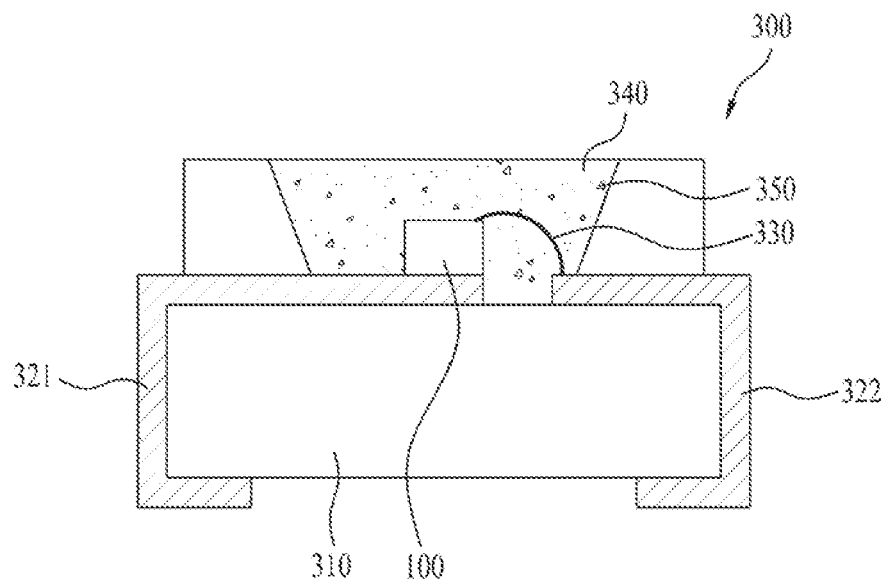
FIG. 2 is a view showing a first embodiment of a light emitting device package including the light emitting device.

FIG. 2 is a view showing a first embodiment of a light emitting device package including the light emitting device.

The light emitting device package 300 according to the present embodiment includes a body 310 having a cavity, a first lead frame 321 and a second lead frame 322 installed to the body 310, the light emitting device 100 of the above described embodiments installed on the body 310 and electrically connected to the first lead frame 321 and the second lead frame 322, and a molding part 430 within the cavity.

The body 310 may be formed of a silicon material, a synthetic resin material, or a metal material. When the body 310 is formed of a conductive material, such as a metal material, although not shown, an insulating layer may be coated over a surface of the body 310 to prevent electrical short-circuit between the first and second lead frames 321 and 322.

The first lead frame 321 and the second lead frame 322 are electrically isolated from each other, and serve to supply current to the light emitting device 100. In addition, the first lead frame 321 and the second lead frame 322 may reflect light generated in the light emitting device 100 to increase light efficiency and may outwardly dissipate heat generated in the light emitting device 100.

The light emitting device 100 may be disposed on the body 310, or may be disposed on the first lead frame 321 or the second lead frame 322. A vertical light emitting device exemplarily shown in FIG. 1A or a horizontal light emitting device exemplarily shown in FIG. 1B may be adopted.

In the present embodiment, the first lead frame 321 is directly connected to the light emitting device 100 in an electrically conductive manner, and the second lead frame 322 is connected to the light emitting device 100 via a wire 330. The light emitting device 100 may be connected to the lead frames 321 and 322 via wire bonding, flip-chip bonding, or die bonding, for example.

The molding part 340 may enclose and protect the light emitting device 100. In addition, the molding part 340 may contain phosphors 350 to vary the wavelength of light emitted from the light emitting device 100.

Light having a first wavelength, emitted from the light emitting device 100, is excited by the phosphors 350 to thereby be converted into light having a second wavelength. As the light having the second wavelength passes through a lens (not shown), an optical path of the light may be changed.

In one embodiment, the phosphors 350 may include a first phosphor to emit light having a yellow wavelength, a second phosphor to emit light having a green wavelength, and a third phosphor to emit light having a red wavelength. Specifically, the first phosphor may be a silicate-based phosphor, and the second phosphor and the third phosphor may be nitride-based phosphors. More specifically, the first phosphor may contain $(Ba, Sr)_2SiO_4:Eu$, the second phosphor may contain $La_3Si_6N_{11}:Ce$, and the third phosphor may contain $(Sr, Ca)AlSiN_3:Eu$.

When excited by light having a blue wavelength, light emitted from the first phosphor has a peak wavelength within a range of 553~558 nm. The minimum value of 553 nm and the maximum value of 558 nm of the peak wavelength may have a tolerance of ±1 nm respectively. A full width at half maximum of light emitted from the first phosphor is within a range of 86~88 nm, and may have a tolerance of ±1 nm.

Light emitted from the second phosphor has a peak wavelength of 535 nm and a full width at half maximum of 107 nm. Light emitted from the third phosphor has a peak wavelength of 625 nm and a full width at half maximum of 81 nm. Here, light from the second phosphor and light from the third phosphor may be emitted as the second phosphor and the third phosphor are excited by light having a blue wavelength.

In the graph in which the axis of abscissa is the wavelength of light and the axis of ordinate is the intensity of light, a full width at half maximum refers to a length between two points where a parabola meets with a horizontal line shown at a position corresponding to half (50%) of a peak wavelength of light having a corresponding wavelength.

Figure 3A:
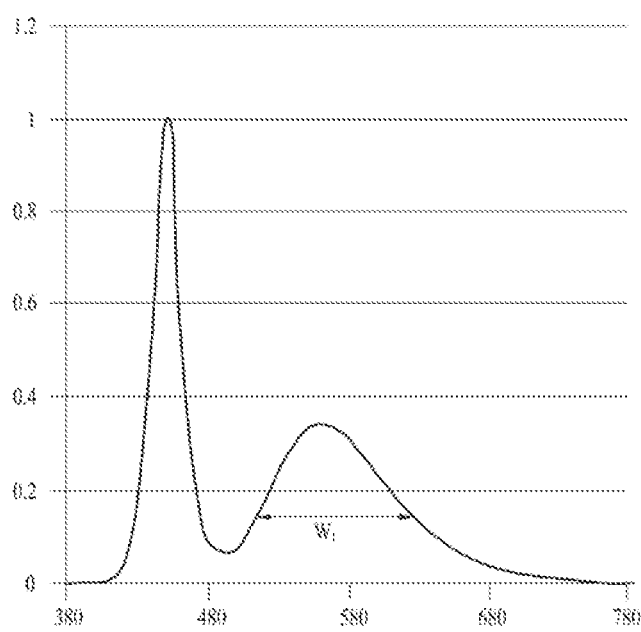
FIGS. 3A and 3B are views respectively showing the light emission spectrum of a conventional light emitting device package and the light emission spectrum of a light emitting device package including phosphors according to one embodiment.
Figure 3B:
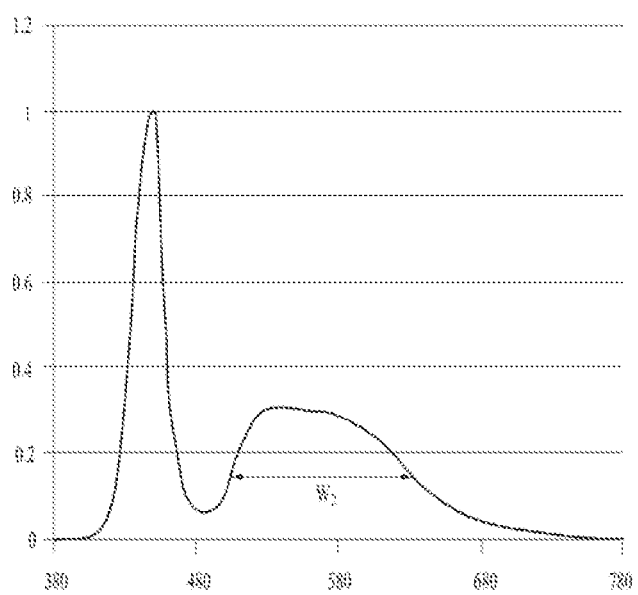

FIG. 3A is a view showing the light emission spectrum of a conventional light emitting device package, and FIG. 3B is a view showing the light emission spectrum of a light emitting device package including the phosphors according to one embodiment.

As exemplarily shown in FIGS. 3A and 3B, the spectrum of blue light emitted from the light emitting device has one peak near a wavelength of 450 nm, and light emitted when the phosphors are excited has a peak within a longer wavelength range than that of blue light. The light emitting device package exemplarily shown in FIG. 3A includes only a silicate phosphor, and a full width at half maximum $W_1$ of light emitted from the phosphor is about 96 nm.

The light emitting device package exemplarily shown in FIG. 3B includes the phosphors according to the above described embodiment. A full width at half maximum $W_2$ of mixed light emitted from the first phosphor to the third phosphor may be 110 nm or more, and more particularly may be about 115 nm, which is wider than a full width at half maximum of light emitted from each of the first phosphor to the third phosphor. The full width at half maximum $W_2$ of light emitted from all of the phosphors exemplarily shown in FIG. 3B is wider than the full width at half maximum $W_1$ of light emitted from the single silicate-based phosphor exemplarily shown in FIG. 3A.

The following Table 1 represents chromaticity coordinates of a conventional Yttrium Aluminum Garnet (YAG) phosphor and the phosphors according to the present embodiment.

TABLE 1

|  | YAG | Silicate |
| --- | --- | --- |
| NTSC(%) | 68.97 | 64.92 |
| sRGB(%) | 94.05 | 88.80 |
| Rx | 0.646 | 0.641 |
| Ry | 0.333 | 0.338 |
| Gx | 0.314 | 0.331 |
| Gy | 0.584 | 0.572 |
| Bx | 0.152 | 0.151 |
| By | 0.049 | 0.046 |
| Luminous intensity(cd) | 2.98 | 2.96 |

The silicate phosphor of Table 1 may be excited by a light emitting device that emits light having a wavelength of 153 nm, and the YAG phosphor may be excited by a light emitting device that emits light having a wavelength of 149 nm. The YAG phosphor of Table 1 has a peak wavelength of 548 nm and a full width at half maximum of 123 nm, and the silicate phosphor has a peak wavelength of 561 nm and a full width at half maximum of 96 nm.

In the present embodiment, a silicate-based yellow phosphor, and nitride-based green phosphor and red phosphor are mixed with each other to achieve chromaticity coordinates most similar to those of the conventional YAG phosphor.

That is, when the occupation volume rate of the phosphors among the volume of the entire cavity is 11% and (Ba, Sr)$_2$SiO$_4$:Eu as the yellow phosphor, La$_2$Si$_6$N$_{11}$:Ce as the green phosphor, and (Sr, Ca)AlSiN$_3$:Eu as the red phosphor are mixed in a weight ratio of 68:30:2, the phosphors show chromaticity coordinates similar to those of the YAG phosphor.

In another embodiment, the phosphors 350 may include a first phosphor to emit light having a yellow wavelength, a second phosphor to emit light having a green wavelength, and a third phosphor to emit light having a red wavelength. Specifically, the first phosphor, the second phosphor, and the third phosphor may be nitride-based phosphors, and the first phosphor may contain (Ba, Sr)Si$_2$(O, Cl)$_2$N$_2$:Eu, the second phosphor may contain La$_3$Si$_6$N$_{11}$:Ce, and the third phosphor may contain (Sr, Ca)AlSiN$_3$:Eu.

When excited by light having a blue wavelength, light emitted from the first phosphor has a peak wavelength of 558 nm and a full width at half maximum of 87 nm. Light emitted from the second phosphor has a peak wavelength of 535 nm and a full width at half maximum of 107 nm. Light emitted from the third phosphor has a peak wavelength of 625 nm and a full width at half maximum of 81 nm.

In the graph in which the axis of abscissa is the wavelength of light and the axis of ordinate is the intensity of light, a full width at half maximum refers to a length between two points where a parabolar meets with a horizontal line shown at a position corresponding to half (50%) of a peak wavelength of light having a corresponding wavelength.

Figure 3C:
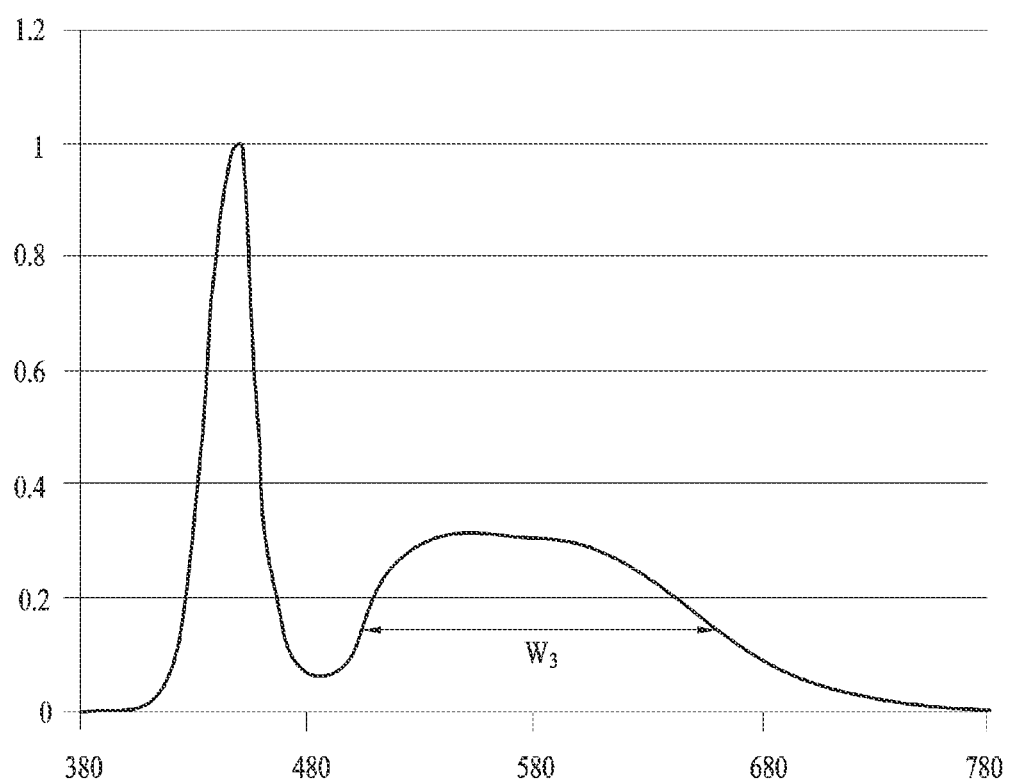
FIG. 3C is a view showing a light emission spectrum of a light emitting device package including phosphors according to another embodiment.

FIG. 3C is a view showing the light emission spectrum of a light emitting device package including the phosphors according to the secondly described embodiment.

The light emitting device package as exemplarily shown in FIG. 3C includes the aforementioned three kinds of phosphors, a full width at half maximum $W_3$ of mixed light emitted from the first phosphor to the third phosphor may be within a range of 119~130 nm, and more particularly may be about 125 nm, which is greater than a full width at half maximum of light emitted from each of the first phosphor to the third phosphor. The full width at half maximum $W_3$ of light emitted from all of the phosphors exemplarily shown in FIG. 3C is greater than the full width at half maximum $W_1$ of light emitted from the single silicate-based phosphor exemplarily shown in FIG. 3A.

The phosphors of the secondly described embodiment in which the nitride-based yellow phosphor, green phosphor and red phosphor are mixed with one another may show chromaticity coordinates the most similar to that of the conventional YAG phosphor.

That is, when the occupation volume rate of the phosphors among the volume of the entire cavity is 11% and (Ba, Sr)Si$_2$(O, Cl)$_2$N$_2$:Eu as the yellow phosphor, La$_3$Si$_6$N$_{11}$:Ce as the green phosphor, and (Sr, Ca)AlSiN$_3$:Eu as the red phosphor are mixed in a weight ratio of 27:70:3, the phosphors show chromaticity coordinates similar to those of the YAG phosphor.

Figure 4:
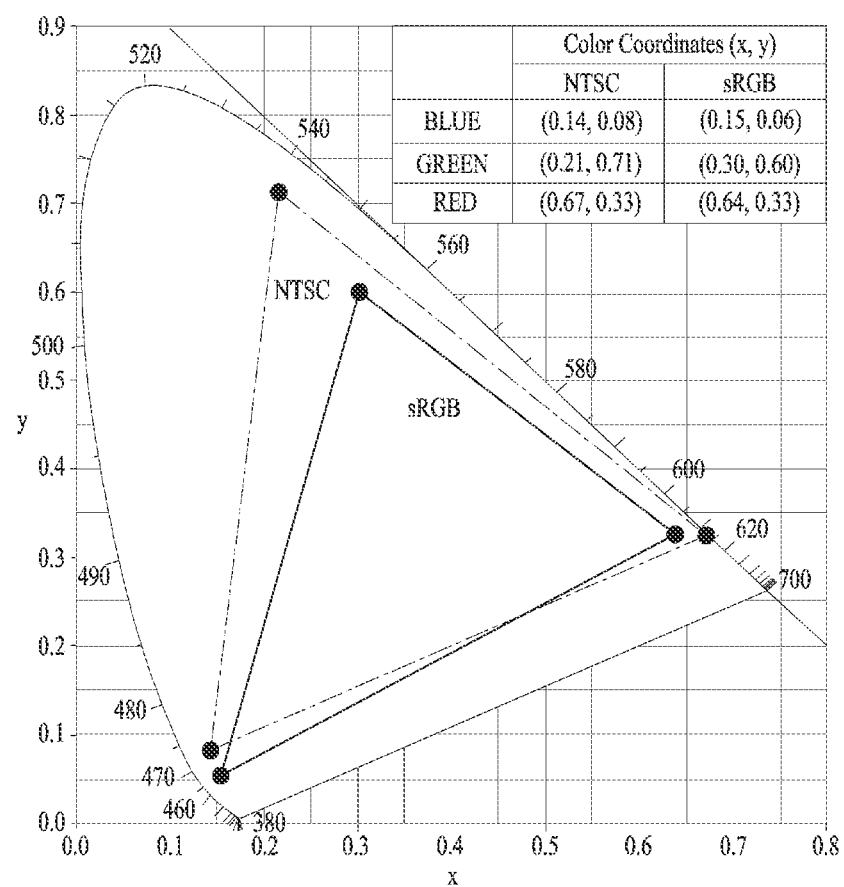
FIG. 4 is a view comparing CIE color coordinates, NTSC coordinates, and sRGB color coordinates with one another.

FIG. 4 is a view comparing CIE color coordinates, NTSC coordinates, and sRGB color coordinates with one another.

CIE 1931 color coordinates represent a ratio of the area of a triangle defined by three R, G, B points to the area of a triangle defined by NTSC coordinates. As this numerical value increases, this means more vivid color reproduction. sRGB is the standard proposed for unification of designation methods with respect to colors of various display apparatuses.

In the sRGB color coordinates, chromaticity coordinates of red, green, and blue are (0.64, 0.33), (0.30, 0.60), and (0.15, 0.06) respectively. It will be appreciated that chromaticity coordinates of red, green, and blue of the present embodiment are (0.634, 0.332), (0.306, 0.616) and (0.152, 0.054) respectively, and represent color reproduction similar to chromaticity coordinates (0.637, 0.331), (0.308, 0.619) and (0.153, 0.054) of the YAG phosphor.

In addition, in the sRGB color coordinates, an allowable tolerance of the above described chromaticity coordinates of red, green and blue is ±3/100. In both the firstly described embodiment and the secondly described embodiment, the chromaticity coordinates of red, green and blue satisfy the aforementioned tolerance.

When the weight ratio of the yellow phosphor to the green phosphor to the red phosphor escapes from the aforementioned range, chromaticity coordinates of each color light in white light may be deteriorated.

In particular, the above described phosphors may have the occupation volume rate of 10.5%~11.5% among the volume of the cavity of the light emitting device package. When the volume of the phosphors is excessively less than the volume of the cavity, the phosphors may not be sufficiently excited by light emitted from the light emitting device. When the volume of the phosphors is excessively greater than the volume of the cavity, absorption of blue light is excessive, which makes realization of white light difficult.

In the phosphors according to the firstly described embodiment, the weight ratio of the first phosphor to the second phosphor to the third phosphor is as follows.

The weight of the second phosphor may be 0.3~0.6 times the weight of the first phosphor, the sum of the weights of the first phosphor and the second phosphor may be 95% or more of the sum weight of all of the phosphors, the weight of the third phosphor may be less than 5% of the sum weight of all of the phosphors, and the sum of the weights of the first phosphor, the second phosphor and the third phosphor may have a value of 100%.

The first phosphor, the second phosphor, and the third phosphor may respectively be 60%~75%, 20%~35%, and 2%~3% of the weight of all of the phosphors. More particularly, the first phosphor, the second phosphor, and the third phosphor may be mixed in a weight ratio of 65:33:2 or 70:27:3. In this case, a full width at half maximum of light emitted from the phosphors is 110 nm or more.

An excessively great amount of the first phosphor may cause deviation of the spectrum of light emitted from the light emitting device to yellow, an excessively great amount of the second phosphor may cause deviation of the spectrum of light emitted from the light emitting device to green, and an excessively great amount of the third phosphor may cause deviation of the spectrum of light emitted from the light emitting device to red. An excessively small quantity of each phosphor may mean an excessively great quantity of other phosphors, causing variation of the spectrum of light.

In this case, green light may have an x-coordinate CIEx ranges from 0.296 to 0.316 and a y-coordinate CIEy ranges from 0.606 to 0.626, red light may have an x-coordinate CIEx ranges from 0.624 to 0.644 and a y-coordinate CIEy ranges from 0.322 to 0.342, and blue light may have an x-coordinate CIEx ranges from 0.142 to 0.162 and a y-coordinate CIEy ranges from 0.044 to 0.649.

The light emitting device package including the phosphors according to the firstly described embodiment may realize white light from the light emitting device that emits blue light using a silicate-based yellow phosphor and nitride-based green phosphor and red phosphor, and may achieve high thermal stability without deterioration of luminous intensity.

In the case of the phosphors according to the secondly described embodiment, the weight ratio of the first phosphor to the second phosphor to the third phosphor is as follows.

The weight of the second phosphor may be 0.7~2.5 times the weight of the first phosphor, the sum of the weights of the first phosphor and the second phosphor may be 90% or more of the weights of all of the phosphors, the weight of the third phosphor may be less than 10% of the weights of all of the phosphors, and the sum of the weights of the first phosphor, the second phosphor and the third phosphor may have a value of 100%.

The first phosphor, the second phosphor, and the third phosphor may respectively be 25%~57%, 40%~70%, and 2%~5% of the weight of all of the phosphors. More particularly, the first phosphor, the second phosphor, and the third phosphor may be mixed in a weight ratio of 27:70:3 or 47:50:3. In this case, a full width at half maximum of light emitted from the phosphors is 119 nm or more.

An excessively great amount of the first phosphor may cause deviation of the spectrum of light emitted from the light emitting device to yellow, an excessively great amount of the second phosphor may cause deviation of the spectrum of light emitted from the light emitting device to green, and an excessively great amount of the third phosphor may cause deviation of the spectrum of light emitted from the light emitting device to red. An excessively small quantity of each phosphor may mean an excessively great quantity of other phosphors, causing variation of the spectrum of light.

In this case, green light may have an x-coordinate CIEx ranges from 0.302 to 0.322 and a y-coordinate CIEy ranges from 0.583 to 0.603, red light may have an x-coordinate CIEx ranges from 0.633 to 0.653 and a y-coordinate CIEy ranges from 0.324 to 0.344, and blue light may have an x-coordinate CIEx ranges from 0.143 to 0.163 and a y-coordinate CIEy ranges from 0.039 to 0.059.

The light emitting device package including the phosphors according to the secondly described embodiment may realize white light from the light emitting device that emits blue light using nitride-based yellow, green and red phosphors, and may achieve high thermal stability without deterioration of luminous intensity.

Figure 5:
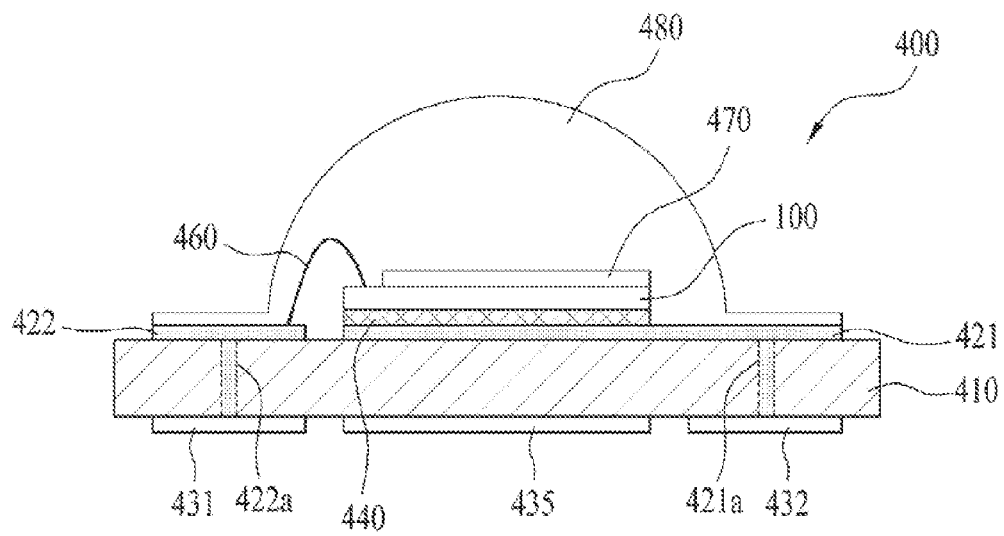
FIG. 5 is a view showing a second embodiment of a light emitting device package including the light emitting device.

FIG. 5 is a view showing a second embodiment of a light emitting device package including the light emitting device.

The light emitting device package 400 according to the second embodiment includes a substrate 410, a first lead frame 421 and a second lead frame 422 disposed on the substrate 410, and the light emitting device 100 fixed to the first lead frame 421 via a conductive adhesive layer 440.

The substrate 410 may be formed of a high thermal conductivity ceramic material. In one example, the substrate 410 may be formed of square sapphire ($Al_2O_3$), the first lead frame 421 and the second lead frame 422 may be formed of a conductive material, such as copper, etc., and gold (Au) plating may be disposed on each lead frame. The first lead frame 421 and the second lead frame 422 may reflect light emitted from the light emitting device 100.

The light emitting device 100 may include a light emitting diode, for example, and may be electrically connected to the second lead frame 422 via a wire 460. The wire 460 may be formed of a conductive material, such as gold (Au), and may have a diameter with a range of 0.8~1.6 mm. When the wire 460 is excessively thin, it may be cut by external force. When the wire 460 is excessively thick, material costs may increase and the wire 460 may block light emitted from the light emitting device 100. Although the present embodiment adopts a vertical light emitting device, a horizontal light emitting device or a flip chip type light emitting device may be adopted.

A phosphor layer 470 is disposed on the light emitting device 100 in a conformal coating manner and has a constant thickness. A molding part 480 is disposed to enclose the light emitting device 100, etc. The molding part 480 may have a dome shape, but may have various other shapes for adjustment of a light emission angle of the light emitting device package 400.

The molding part 480 may enclose and protect the light emitting device 100, and serve as a lens to change the path of light emitted from the light emitting device 100. The phosphor layer 470 converts light having a first wavelength emitted from the light emitting device 100 into light having a second wavelength.

Three pads 431, 432 and 435 may be disposed on a rear surface of the substrate 410, and may be formed of a high thermal conductivity material. These pads 431, 432 and 435, arranged below the substrate 410, may serve to fix the light emitting device package 400 to a housing, for example, and may also serve as a heat dissipation path.

The first and second lead frames 421 and 422 and the three pads 431, 432 and 435 as described above may serve as electrodes. The first lead frame 421 and the second lead frame 422 may be disposed on the substrate 410, and serve as upper electrodes. The first pad 431 and the second pad 432 may be disposed below the substrate 410, and serve as lower electrodes. The upper electrodes and the lower electrodes may be connected to each other through via-holes 421*a* and 422*a* that will be described hereinafter.

That is, the first lead frames 421 and 422 may serve as upper electrodes, the first pad 431 and the second pad 432 may serve as lower electrodes, and the via-holes 421*a* and 422*a* may be filled with a conductive material to form via-electrodes. These upper electrodes, lower electrodes, and via-electrodes may be referred to as first and second electrode parts.

In the light emitting device package according to the present embodiment, the phosphors 470 may include a first phosphor to emit light having a yellow wavelength, a second phosphor to emit light having a green wavelength, and a third phosphor to emit light having a red wavelength, in the same manner as the above described embodiments.

Specifically, the first phosphor may be a silicate-based phosphor, and the second phosphor and the third phosphor may be nitride-based phosphors. More specifically, the first phosphor may contain $(Ba, Sr)_2SiO_4:Eu$, the second phosphor may contain $La_3Si_6N_{11}:Ce$, and the third phosphor may contain $(Sr, Ca)AlSiN_3:Eu$.

Accordingly, the light emitting device package according to the present embodiment may realize white light from the light emitting device that emits blue light using the silicate-based yellow phosphor and the nitride-based green phosphor and red phosphor, and may achieve high thermal stability without deterioration of luminous intensity.

Figure 6:
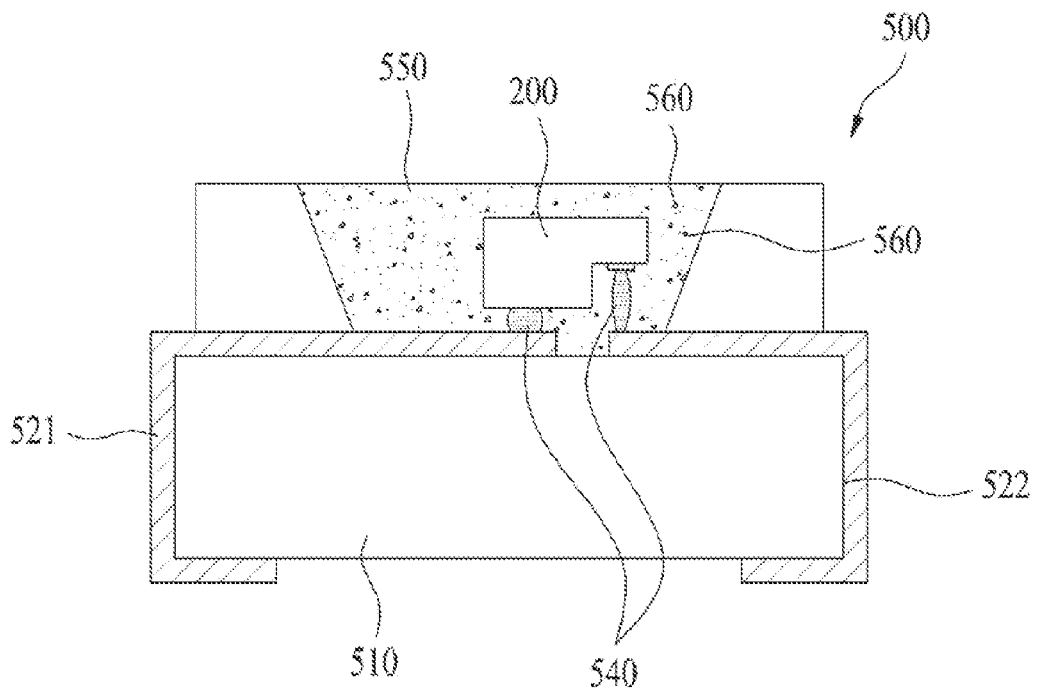
FIG. 6 is a view showing a third embodiment of a light emitting device package including the light emitting device.

FIG. 6 is a view showing a third embodiment of a light emitting device package including the light emitting device.

The light emitting device package 500 according to the present embodiment is a flip chip type light emitting device package, and includes a body 510 having a cavity, a first lead frame 521 and a second lead frame 522 disposed on the body 510, the light emitting device 200 according to the secondly described embodiment, the light emitting device 200 being installed to the body 510 and electrically connected to the first lead frame 521 and the second lead frame 522, and a molding part 550 formed in the cavity.

The body 510 may be formed of a silicon material, a synthetic resin material, or a metal material. When the body 510 is formed of a conductive material, such as a metal material, etc., although not shown, an insulating layer may be coated on a surface of the body 510 to prevent electrical short-circuit between the first and second lead frames 521 and 522.

The first lead frame 521 and the second lead frame 522 are electrically isolated from each other, and serve to supply current to the light emitting device 200. In addition, the first lead frame 521 and the second lead frame 522 may reflect light generated in the light emitting device 200 to increase light efficiency and may outwardly dissipate heat generated in the light emitting device 200.

The light emitting device 200 may be electrically connected to the first lead frame 521 and the second lead frame 522 via ball-shaped solders 540.

The molding part 550 may enclose and protect the light emitting device 200. In addition, phosphors 560 may be distributed in the molding part 550 to convert a wavelength of light emitted from the light emitting device 200 throughout a light emission area of the light emitting device package 500.

Light having a first wavelength, emitted from the light emitting device 200, for example, light having a blue wavelength, is excited by the phosphors 560 to thereby be converted into light having a second wavelength. The optical path of light having the second wavelength may be changed as the light passes through a lens (not shown).

The above described light emitting device package 500 may realize white light from the light emitting device that emits blue light using a silicate-based yellow phosphor and nitride-based green phosphor and red phosphor, and may achieve high thermal stability without deterioration of luminous intensity.

Figure 7:
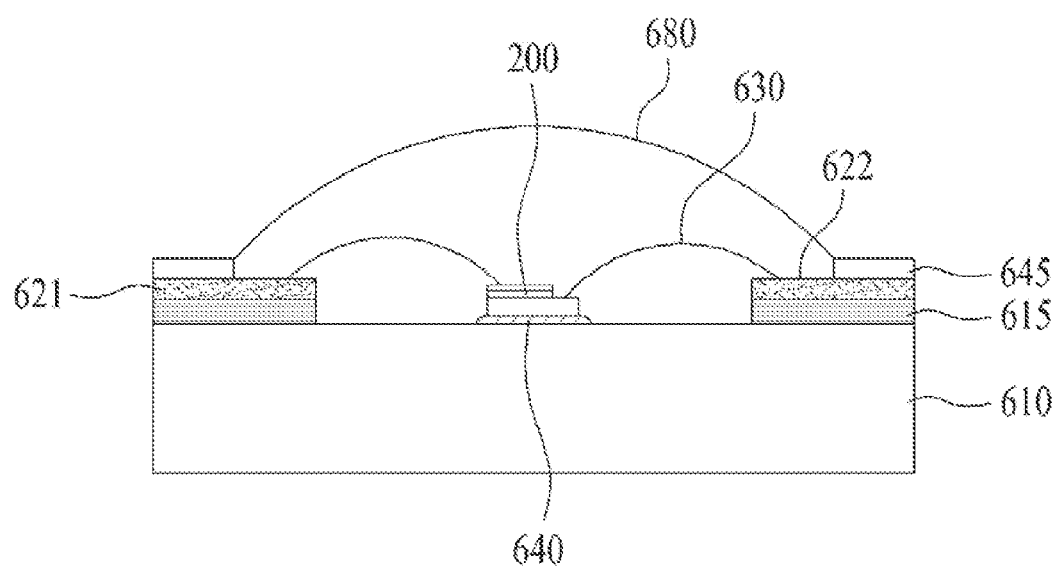
FIG. 7 is a view showing a fourth embodiment of a light emitting device package including the light emitting device.

FIG. 7 is a view showing a fourth embodiment of a light emitting device package including the light emitting device. The present embodiment illustrates a Chip On Board (COB) type light emitting device package.

The light emitting device package 600 according to the present embodiment includes a base metal 610, an insulating layer 615, first and second lead frames 621 and 622, and a dam 645. The light emitting device 200 may be fixed on the base metal 610 via a solder 640, and may be electrically connected to the first and second lead frames 621 and 622 via wires 630.

The first and second lead frames 621 and 622 may be insulated from the base metal 610 via an insulating layer 615, and a molding part 680 enclosing the light emitting device 200 may contain phosphors. The dam 645 disposed on the first and second lead frames 621 and 622 may fix an edge of the molding part 680. The phosphors may be contained in the molding part 680, or may be disposed on the light emitting device 200 via conformal coating.

The above described light emitting device package 600 may realize white light from the light emitting device that emits blue light using a silicate-based yellow phosphor and nitride-based green phosphor and red phosphor, and may achieve high thermal stability without deterioration of luminous intensity.

Figure 8:
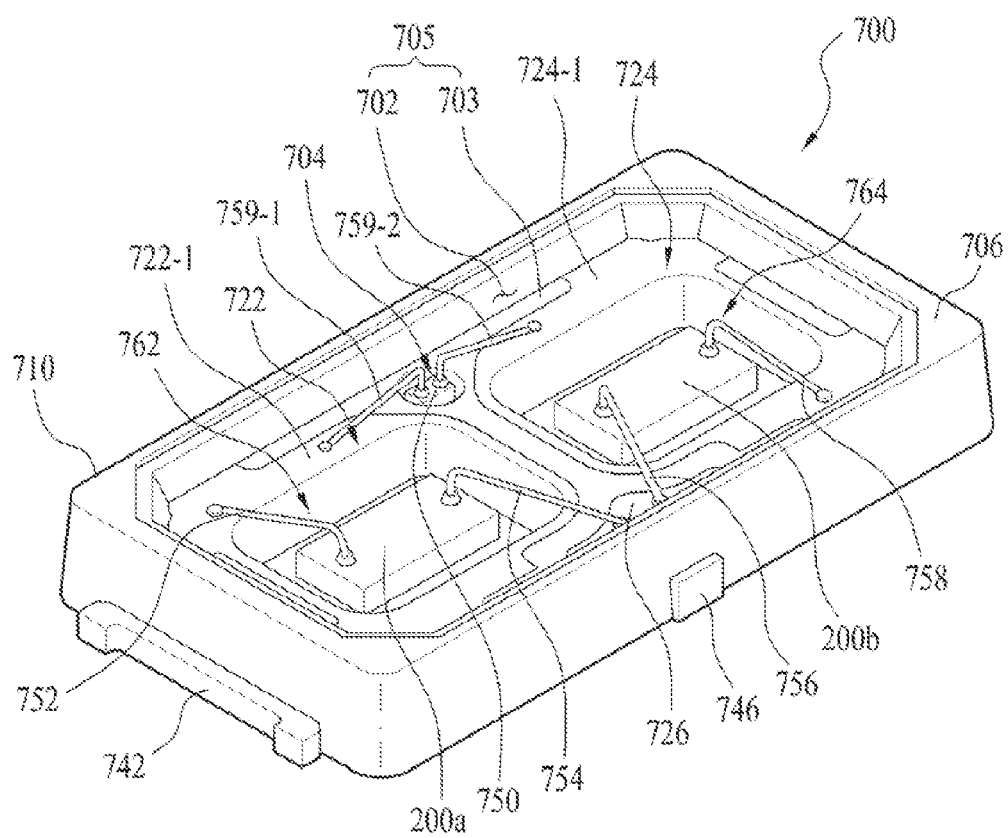
FIG. 8 is a view showing a fifth embodiment of a light emitting device package including the light emitting device.

FIG. 8 is a view showing a fifth embodiment of a light emitting device package including the light emitting device. The light emitting device package according to the present embodiment is shown as including light emitting devices provided in two reflector cups respectively.

The light emitting device package 700 includes a body 710, a first reflector cup 722, a second reflector cup 724, a connector 726, light emitting devices 200*a* and 200*b*, a Zener diode 750, and wires 751 to 759.

The body 710 may be a Printed Circuit Board (PCB) formed of at least one of a resin material, such as polyphthalamide (PPA), silicon (Si), a metal material, Photo Sensitive Glass (PSG), and sapphire $(Al_2O_3)$. The body 710 may be formed of a resin material, such as polyphthalamide (PPA).

The body 710 may be formed as a conductor. When the body 710 is formed of an electrically conductive material, an insulating film (not shown) may be formed on a surface of the body 710 to prevent electrical short-circuit between the body 710 and the first reflector cup 722, the second reflector cup 724, or the connector 726.

The shape of an upper surface 706 of the body 710, viewed from above, may be selected from among various shapes, such as a triangle, square, polygon, and circle, according to use purposes and designs.

The light emitting device package 700 according to the present embodiment may be used in an edge type backlight unit (BLU). When the light emitting device package 700 is applied to a portable flashlight or home lighting, the shape and size of the body 710 may be changed to ensure easy installation in the portable flashlight or home lighting.

The body 710 includes a top-opened cavity 705 defined by a sidewall 702 and a bottom 703 (hereinafter referred to as "body cavity").

The body cavity 705 may have a cup shape or a concave container shape, for example. The sidewall 702 of the body cavity 705 may be perpendicular to or tilted relative to the bottom 703.

When viewed from above, the body cavity 705 may have a circular shape, an oval shape, or a polygonal shape (e.g., a square shape). Corners of the body cavity 705 may be rounded. The shape of the body cavity 705 viewed from above may be generally an octagonal shape, and the sidewall 702 of the body cavity 705 may be divided into 8 faces including first faces and second faces. Here, the first faces are faces of the body cavity 705 facing respective corners of the body 710 and the second faces are faces between the first faces. The area of the first faces may be less than the area of the second faces.

The first reflector cup 722 and the second reflector cup 724 may be spaced apart from each other within the body 710 below the bottom 703 of the body cavity 705. The first reflector cup 722 may take the form of a top-opened recessed structure in the bottom 703 of the body cavity 705.

For example, the bottom 703 of the body cavity 705 may have a top-opened first cavity 762 defined by a sidewall and a bottom, and the first reflector cup 722 may be disposed in the first cavity 762.

The second reflector cup 724 may take the form of a top-opened recessed structure in the bottom 703 of the body cavity 705, the second reflector cup 724 being spaced apart from the first cavity 762. For example, the bottom 703 of the body cavity 705 may have a top-opened second cavity 764 defined by a sidewall and a bottom, and the second reflector cup 724 may be disposed in the second cavity 764. In this case, the second cavity 764 may be spaced apart from the first cavity 762.

A portion of the bottom 703 of the body cavity 705 is located between the first reflector cup 722 and the second reflector cup 724. The first reflector cup 722 and the second reflector cup 724 may be spaced apart from each other and be isolated from each other by the portion of the bottom 703.

When viewed from above, the first cavity 762 and the second cavity 764 may have a cup shape or a concave container shape, for example. The sidewall of each cavity may be perpendicular to or tilted relative to the bottom.

At least a portion of each of the first reflector cup 722 and the second reflector cup 724 may penetrate the body 710 to thereby be exposed to the outside of the body 710. Since at least a portion of the first reflector cup 722 and the second reflector cup 724 is exposed to the outside of the body 710, heat generated in the first light emitting device 200a and the second light emitting device 200b may be more efficiently dissipated to the outside of the body 710.

For example, one end 742 of the first reflector cup 722 may penetrate a first side surface of the body 710 to thereby be exposed to the outside of the body 710. In addition, one end 744 of the second reflector cup 724 may penetrate a second side surface of the body 710 to thereby be exposed to the outside of the body 710. Here, the first side surface and the second side surface may be opposite.

The first reflector cup 722 and the second reflector cup 724 may be formed of a metal material, such as silver, gold, or copper, for example, and may be plated with the aforementioned material. The first reflector cup 722 and the second reflector cup 724 may be formed of the same material as the body 710, and may be integrated with the body 710. Alternatively, the first reflector cup 722 and the second reflector cup 724 may be formed of a different material from the body 710, and may not be integrated with the body 710. The first reflector cup 722 and the second reflector cup 724 may be symmetrical to each other in terms of the shape and size on the basis of the connector 726. The connector 726 is spaced apart from each of the first reflector cup 722 and the second reflector cup 724 in the body 710 below the body cavity 705. The connector 726 may be formed of an electrically conductive material.

As exemplarily shown, the connector 726 may be disposed between the first reflector cup 722 and the second reflector cup 724. For example, the connector 726 may be disposed in the bottom of the body cavity 705 close to a third side surface of the body 710 between the first reflector cup 722 and the second reflector cup 724.

At least a portion of the connector 726 may penetrate the body 710 to thereby be exposed to the outside of the body 710. For example, one end of the connector 726 may penetrate the third side surface of the body 710 to thereby be exposed to the outside. Here, the third side surface of the body 710 is any one side surface perpendicular to the first side surface and the second side surface of the body 710.

The Zener diode 750 is disposed on any one of the first reflector cup 722 and the second reflector cup 724 to enhance withstanding voltage of the light emitting device package 700. The Zener diode 750 may be mounted on an upper surface 724-1 of the second reflector cup 724.

Each of the first reflector cup 722 and the second reflector cup 724 may be filled with phosphors. When the first light emitting device 200a and the second light emitting device 200b emit light having the same wavelength, the first reflector cup 722 and the second reflector cup 724 may be filled with the same composition of phosphors, or the phosphors may be disposed on each of the light emitting devices 200a and 200b via conformal coating.

The above described light emitting device package 700 may realize white light from the light emitting device that emits blue light using a silicate-based yellow phosphor and nitride-based green phosphor and red phosphor, and may achieve high thermal stability without deterioration of luminous intensity.

An array of the light emitting device packages according to the present embodiment may be disposed on a board, and optical members, such as a light guide panel, a prism sheet, a diffusion sheet, etc., may be disposed in an optical path of the light emitting device packages. The light emitting device packages, the board, and the optical members may function as a lighting unit. In another embodiment, a display apparatus, an indicator, or a lighting system including semiconductor light emitting devices or light emitting device packages according to the above described embodiments may be realized. For example, a lighting system may include a lamp or a street light.

Hereinafter, a backlight unit or a lighting apparatus as one embodiment of a lighting system including the above described light emitting device or the above described light emitting device package will be described.

Figure 9:
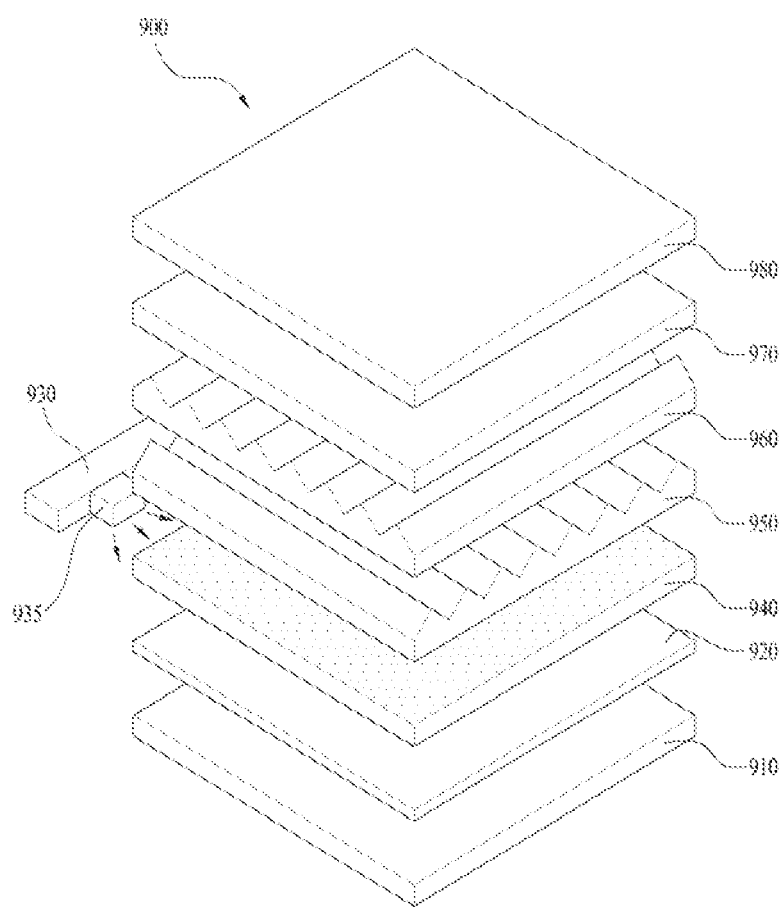
FIG. 9 is a view showing one embodiment of an image display apparatus including a light emitting device package.

FIG. 9 is a view showing one embodiment of an image display apparatus including the light emitting device package.

As exemplarily shown, the image display apparatus 900 according to the present embodiment includes a light source module, a reflector 920 on a bottom cover 910, a light guide panel 940 disposed in front of the reflector 620 to guide light, emitted from the light source module, forward of the image display apparatus 900, a first prism sheet 950 and a second prism sheet 960 disposed in front of the light guide panel 940, a panel 970 disposed in front of the second prism sheet 960, and a color filter 980 disposed in front of the panel 970.

The light source module includes a light emitting device package 935 on a circuit board 930. Here, the circuit board 930 may be a PCB, for example, and the light emitting device package 935 is as described above.

The image display apparatus 900 may include an edge type backlight unit as exemplarily shown in FIG. 9, or may include a vertical type backlight unit.

The light emitting device package used in the above described image display apparatus may realize white light from the light emitting device that emits blue light using a silicate-based yellow phosphor and nitride-based green phosphor and red phosphor, and may achieve high thermal stability without deterioration of luminous intensity.

Figure 10:
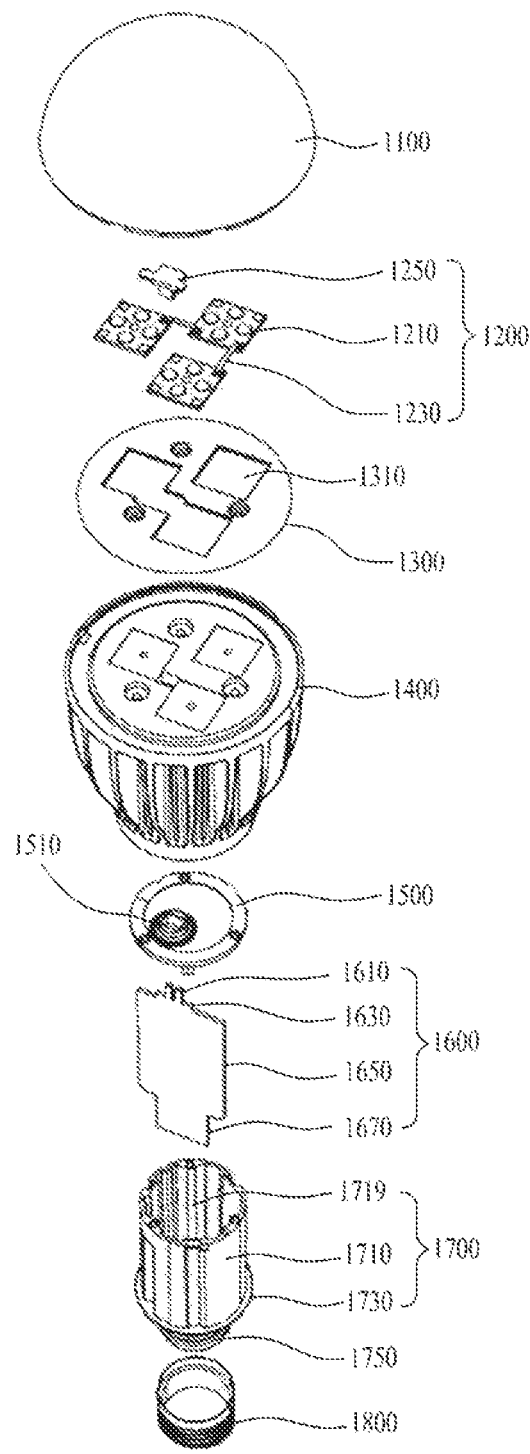
FIG. 10 is a view showing one embodiment of a lighting apparatus including a light emitting device package.

FIG. 10 is a view showing one embodiment of a lighting apparatus including the light emitting device package.

The lighting apparatus according to the present embodiment may include a cover 1100, a light source module 1200, a radiator 1400, a power supply unit 1600, an inner case 1700, and a socket 1800. In addition, the lighting apparatus according to the present embodiment may further include at least one of a member 1300 and a holder 1500, and the light source module 1200 may include the light emitting device package according to the above described embodiments.

The cover 1100 may take the form of a hollow bulb or semi-sphere having an opening. The cover 1100 and the light source module 1200 may be optically coupled to each other. For example, the cover 1100 may diffuse, scatter, or excite light emitted from the light source module 1200. The cover 1100 may be an optical member. The cover 1100 may be coupled to the radiator 1400, and may have a coupling portion for coupling with the radiator 1400.

An inner surface of the cover 1100 may be coated with an ivory white paint. The ivory white paint may contain a diffuser to diffuse light. The surface roughness of the inner surface of the cover 1100 may be greater than the surface roughness of an outer surface of the cover 1100. This serves to sufficiently scatter and diffuse light emitted from the light source module 1200 so as to emit the light to the outside.

The cover 1100 may be formed of glass, plastic, polypropylene (PP), polyethylene (PE), and polycarbonate (PC), for example. Here, polycarbonate is advantageous to achieve excellent light-resistance, heat-resistance, and mechanical strength. The cover 1100 may be transparent such that the light source module 1200 can be seen from the outside, or may be opaque. The cover 1100 may be formed via blow molding.

The light source module 1200 may be disposed on a surface of the radiator 1400. Thus, heat from the light source module 1200 is transferred to the radiator 1400. The light source module 1200 may include a plurality of light emitting device packages 1210, connection plates 1230, and a connector 1250.

Phosphors may be coated over at least one surface of the cover 1100, or may be contained in the light emitting device package 1210 of the light source module 1200.

The member 1300 is disposed on an upper surface of the radiator 1400, and has guide recesses 1310 for insertion of the light emitting device packages 1210 and the connector 1250. The guide recesses 1310 correspond to boards of the light emitting device packages 1210 and the connector 1250 in a one to one ratio.

A reflective material may be applied to or coated over a surface of the member 1300. For example, a white paint may be applied to or coated over the surface of the member 1300. The member 1300 reflects light, reflected from the inner surface of the cover 1100 to the light source module 1200, to return the light to the cover 1100. As such, the lighting apparatus according to the present embodiment may achieve enhanced light efficiency.

The member 1300 may be formed of an insulating material, for example. The connection plates 1230 of the light source module 1200 may be formed of an electrically conductive material. As such, electric contact between the radiator 1400 and the connection plates 1230 may be accomplished. The member 1300 may be formed of an insulating material to prevent electrical short-circuit between the connection plates 1230 and the radiator 1400. The radiator 1400 may radiate heat from the light source module 1200 and heat from the power supply unit 1600.

The holder 1500 is configured to close a receiving recess 1719 defined by an insulating portion 1710 of the inner case 1700. As such, the power supply unit 1600, received inside the insulating portion 1710 of the inner case 1700, is hermetically sealed. The holder 1500 has a guide protrusion 1510. The guide protrusion 1510 has a hole for penetration of a protrusion 1610 of the power supply unit 1600.

The power supply unit 1600 processes or converts an external electrical signal to transmit the same to the light source module 1200. The power supply unit 1600 is received in the receiving recess 1719 of the inner case 1700, and is hermetically sealed in the inner case 1700. The power supply unit 1600 may include the protrusion 1610, a guide portion 1630, a base 1650, and an extension portion 1670.

The guide protrusion 1630 is configured to protrude outward from one side of the base 1650. The guide portion 1630 may be inserted into the holder 1500. A plurality of elements may be arranged on one surface of the base 1650. The elements, for example, may be a DC converter to convert AC power from an external power source into DC power, a drive chip to control driving of the light source module 1200, and an Electro-Static Discharge prevention element to protect the light source module 1200, but are not limited thereto.

The extension portion 1670 is configured to protrude outward from the other side of the base 1650. The extension portion 1670 is inserted into a connection portion 1750 of the inner case 1700 to receive an electrical signal from an external source. For example, the width of the extension portion 1670 may be equal to or less than the width of the connection portion 1750 of the inner case 1700. The extension portion 1670 may be electrically connected to one end of a positive electrical wire or a negative electrical wire, and the other end of the positive electrical wire or the negative electrical wire may be electrically connected to the socket 1800.

The inner case 1700 may include a molding part as well as the power supply unit 1600 therein. The molding part is formed of harden molding liquid, and may serve to fix the power supply unit 1600 within the inner case 1700.

The light emitting device package used in the above described lighting apparatus may realize white light from the light emitting device that emits blue light using a silicate-based yellow phosphor and nitride-based green phosphor and red phosphor and may achieve high thermal stability without deterioration of luminous intensity. In addition, a full width at half maximum of the spectrum of mixed light emitted when the first phosphor to the third phosphor are excited is 110 nm or more.

As is apparent from the above description, a light emitting device package according to one embodiment may realize white light from a light emitting device that emits blue light using a silicate-based yellow phosphor and nitride-based green phosphor and red phosphor and may achieve high thermal stability without deterioration of luminous intensity. In addition, a full width at half maximum of the spectrum mixed light emitted from the phosphors are excited is 110 nm or more, which results in excellent color reproduction of light having red, green, and yellow wavelengths.

In addition, a light emitting device package according to another embodiment may realize white light from a light emitting device that emits blue light using nitride-based yellow, green, and red phosphors and may achieve high thermal stability without deterioration of luminous intensity. In addition, a full width at half maximum of the spectrum of mixed light emitted from the phosphors are excited is 119 nm or more, which results in excellent color reproduction of light having red, green, and yellow wavelengths.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
   a first electrode and a second electrode electrically isolated from each other;
   at least one light emitting device electrically connected to each of the first electrode and the second electrode to emit light having a first wavelength; and
   phosphors excited by light having a blue wavelength emitted from the light emitting device to emit light having a second wavelength, the phosphors including a silicate-based first phosphor emitting light having a yellow wavelength, a nitride-based second phosphor emitting light having a green wavelength, and a nitride-based third phosphor emitting light having a red wavelength, wherein a full width at half maximum of the spectrum of mixed light, emitted from the first phosphor to the third phosphor as the phosphors are excited by light having a blue wavelength, is 110 nm or more.

2. The package according to claim 1, wherein a weight percent of the first phosphor is within a range of 60% to 75%, a weight percent of the second phosphor is within a range of 20% to 35%, and a weight percent of the third phosphor is within a range of 2% to 3%.

3. The package according to claim 1, wherein the first phosphor includes $(Ba, Sr)_2SiO_4:Eu$.

4. The package according to claim 1, wherein the second phosphor includes $La_3Si_6N_{11}:Ce$.

5. The package according to claim 1, wherein the third phosphor includes $(Sr, Ca)AlSiN_3:Eu$.

6. The package according to claim 1, wherein the mixed light emitted from the first phosphor, the second phosphor, and the third phosphor is white light, and green light in the white light has chromaticity coordinates CIEx ranges from 0.296 to 0.316 and CIEy ranges from 0.606 to 0.626.

7. The package according to claim 1, wherein the mixed light emitted from the first phosphor, the second phosphor, and the third phosphor is white light, and red light in the white light has chromaticity coordinates CIEx ranges from 0.624 to 0.644 and CIEy ranges from 0.322 to 0.342.

8. The package according to claim 1, wherein the mixed light emitted from the first phosphor, the second phosphor, and the third phosphor is white light, and blue light in the white light has chromaticity coordinates CIEx ranges from 0.142 to 0.162 and CIEy ranges from 0.044 to 0.064.

9. The package according to claim 1, further comprising a molding part enclosing the light emitting device.

10. The package according to claim 9, wherein the phosphors are disposed in the molding part.

11. The package according to claim 1, further comprising a body having a cavity, and wherein the phosphors are disposed in the cavity.

12. A light emitting device package comprising:
    a first electrode and a second electrode electrically isolated from each other;
    at least one light emitting device electrically connected to each of the first electrode and the second electrode to emit light having a first wavelength; and
    phosphors excited by light having a blue wavelength emitted from the light emitting device to emit light having a second wavelength, the phosphors including a first phosphor emitting light having a yellow wavelength, a second phosphor emitting light having a green wavelength, and a third phosphor emitting light having a red wavelength, wherein the first phosphor, the second phosphor, and the third phosphor contain nitrogen, and a full width at half maximum of the spectrum of mixed light, emitted from the first phosphor to the third phosphor as the phosphors are excited by light having a blue wavelength, is 119 nm or more.

13. The package according to claim 12, wherein the first phosphor includes $(Ba, Sr)Si_2(O, Cl)_2N_2:Eu$.

14. The package according to claim 12, wherein the second phosphor includes $La_3Si_6N_{11}:Ce$.

15. The package according to claim 12, wherein the third phosphor includes $(Sr, Ca)AlSiN_3:Eu$.

16. The package according to claim 12, wherein the mixed light emitted from the first phosphor, the second phosphor, and the third phosphor is white light, and green light in the white light has chromaticity coordinates CIEx ranges from 0.302 to 0.322 and CIEy ranges from 0.583 to 0.603.

17. The package according to claim 12, wherein mixed light emitted from the first phosphor, the second phosphor, and the third phosphor is white light, and red light in the white light has chromaticity coordinates CIEx ranges from 0.633 to 0.653 and CIEy ranges from 0.324 to 0.344.

18. The package according to claim 12, wherein mixed light emitted from the first phosphor, the second phosphor, and the third phosphor is white light, and blue light in the white light has chromaticity coordinates CIEx ranges from 0.143 to 0.163 and CIEy ranges from 0.039 to 0.059.

19. The package according to claim 12, further comprising a molding part enclosing the light emitting device, and the phosphors are disposed in the molding part.

20. The package according to claim 12, further comprising a body having a cavity, and wherein the phosphors are disposed in the cavity.

* * * * *